United States Patent
Rault

[19]

[11] Patent Number: 5,914,628
[45] Date of Patent: Jun. 22, 1999

[54] CIRCUIT FOR CONTROLLING A TRIAC AT THE VOLTAGE ZERO

[75] Inventor: Pierre Rault, Saint Cyr Sur Loire, France

[73] Assignee: SGS-Thomson Microelectronics S.A., Saint Genis, France

[21] Appl. No.: 08/951,333

[22] Filed: Oct. 16, 1997

[30] Foreign Application Priority Data

Oct. 16, 1996 [FR] France ................................ 96 12785

[51] Int. Cl.$^6$ ........................... H03K 17/13; H03K 17/72
[52] U.S. Cl. ........................ 327/452; 327/451; 327/476
[58] Field of Search ................................ 327/438, 439, 327/440, 441, 442, 444, 445, 446, 447, 451, 452, 453, 455, 456, 457, 458, 459, 469, 476

[56] References Cited

U.S. PATENT DOCUMENTS

| | | | |
|---|---|---|---|
| 3,723,769 | 3/1973 | Collins | 307/252 UA |
| 3,855,482 | 12/1974 | Wills | 307/252 B |
| 3,883,782 | 5/1975 | Beckwith | 317/16 |
| 3,902,080 | 8/1975 | St. Clair et al. | 307/252 B |
| 4,258,276 | 3/1981 | Beling | 307/252 B |
| 4,645,982 | 2/1987 | Takayanagi | 315/307 |

FOREIGN PATENT DOCUMENTS

| | | | |
|---|---|---|---|
| A-25 59 564 | 5/1977 | Germany | H05B 37/02 |
| 353090855 | 8/1978 | Japan | 327/438 |

*Primary Examiner*—Toan Tran
*Assistant Examiner*—Hai L. Nguyen
*Attorney, Agent, or Firm*—Wolf, Greenfield & Sacks, P.C.

[57] ABSTRACT

The present invention relates to a circuit for controlling a triac at the voltage zero. Two transistors of complementary types are connected in parallel between the gate and the main reference terminal of the triac. The control terminals of the transistors are interconnected and connected to the second main terminal of the triac via a resistor of high value. The gate of the triac is connected to a control potential source via a second resistor.

28 Claims, 1 Drawing Sheet

CIRCUIT FOR CONTROLLING A TRIAC AT THE VOLTAGE ZERO

BACKGROUND OF THE INVENTION

1. Field of the Invention

The present invention relates to the control of high or medium power components of triac type.

2. Discussion of the Related Art

A triac is a switching component which corresponds to the antiparallel association of two thyristors. It is thus likely to block or to let through voltages of one biasing or the other, that is, it may be connected directly in an a.c. network, for example the mains.

A triac includes two main terminals A1 and A2, and a control terminal, called the gate. A triac is likely to enter conduction when a positive or negative potential is present between its terminals A1 and A2 and a negative or positive current pulse flows between the gate terminal and terminal A1 which will be called the reference terminal or main terminal associated with the gate. The triac then remains conductive until the current flowing through it transits through the zero point of the alternating current.

It is known that, when it is desired to control the conduction of a triac for a duration which is long with respect to the mains period, it is advantageous to turn it on at the time when the voltage across the triac is close to zero. This type of control is called a control at the voltage zero although, in fact, it occurs as the voltage across the triac is sufficient to enable its turning-on, for example, around a few volts.

This type of control has the advantage of reducing the current constraints upon switching and to reduce parasitics and harmonics that may be fed back onto the mains. As a result, the reliability of the triac increases. Further, this type of control is now imposed by various standards.

Several known circuits implement this function. However, these circuits exhibit at least one of the following disadvantages. They are complex, require a great number of components, some of which cannot be integrated, for example, capacitors of high value, and/or consume non-negligible power. Some of these circuits even require the use of an auxiliary supply source.

SUMMARY OF THE INVENTION

Thus, an object of the present invention is to provide a circuit for controlling a triac at the voltage zero which avoids the disadvantages of known circuits.

Especially, the present invention aims at implementing such a circuit including a small number of components, all these components being integrable, the circuit further having a low consumption.

To achieve these objects, the present invention provides a circuit for controlling a triac at the voltage zero, including two transistors of complementary types connected in parallel between the gate and the main reference terminal of the triac, the control terminals of the transistors being interconnected and connected to the second main terminal of the triac via a resistor of high value.

According to an embodiment of the present invention, the triac gate is connected to a control potential source via a second resistor.

According to an embodiment of the present invention, the voltage of the control potential source is switchable between the value of the voltage of the reference terminal and a negative value with respect to the voltage of the reference terminal.

According to an embodiment of the present invention, the complementary transistors are NPN and PNP bipolar transistors.

According to an embodiment of the present invention, the complementary transistors are N- and P-channel MOS transistors.

According to an embodiment of the present invention, a bidirectional avalanche diode is connected between the gate of the MOS transistors and the reference terminal.

These objects, characteristics and advantages as well as others, of the present invention, will be discussed in detail in the following non-limiting description of a specific embodiment in relation with the accompanying drawings.

DETAILED DESCRIPTION

Figure 1:
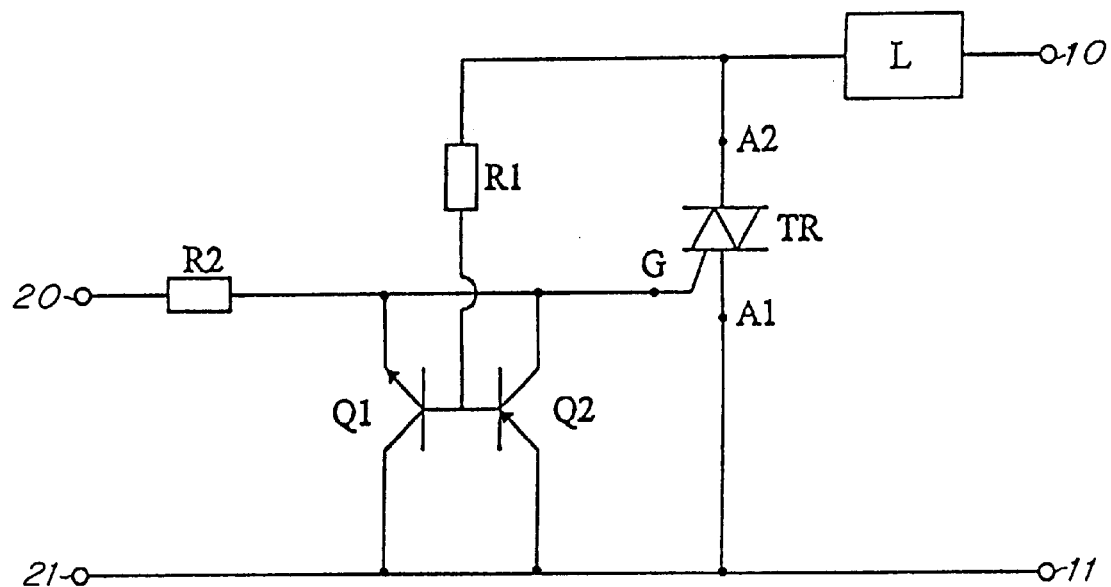
FIG. 1 shows a first embodiment of a circuit for controlling a triac at the voltage zero according to the present invention.

FIG. 1 shows a triac TR connected by a main terminal A2 to a load L, the series connection of load L and triac TR being connected between a.c. voltage terminals 10, 11, for example, the mains. Terminal 11 is at a reference potential, for example, the ground and is connected to the main terminal A1 or reference terminal of the triac.

According to the present invention, two complementary transistors are connected between gate terminal G and reference terminal A1 of the triac. In the example of FIG. 1, these complementary transistors are an NPN-type bipolar transistor Q1 and a PNP-type bipolar transistor Q2. The emitter of transistor Q1 and the collector of transistor Q2 are connected to gate G. The collector of transistor Q1 and the emitter of transistor Q2 are connected to terminal A1 of the triac. The bases of transistors Q1 and Q2 are connected to one another and to terminal A2 via a high value resistor R1. The control order is applied between terminals 20 and 21. Terminal 21 is connected to terminal 11 and forms a reference terminal. Terminal 20 is connected to gate G via a resistor R2. The control order is a signal having a value of 0 volts (the potential of terminals 11 and 21) when it is not desired to turn on the triac and a negative value, for example, −5 volts, when it is desired to turn on the triac.

The circuit operates as follows.

When the voltage on terminal 10 is high, one or the other of transistors Q1 or Q2 is turned on. Terminals G and A1 are then short-circuited by one or the other of the transistors and no control current can flow through terminals G and A1.

When the voltage on terminal 10 is lower than a given threshold, which depends in particular on the value of resistance R1 and on the gain of the transistors, and which can be of around 10 volts, both transistors Q1 and Q2 are blocked and, if the voltage on control terminal 20 is negative, a current will flow from terminal A1 to terminal G and will turn on the triac. Thus, it can be considered that the application of a control order (negative potential) on terminal 20 is delayed until the potential on terminal A2 has dropped to a low value with respect to the potential on terminal A1. A control at the voltage zero is thus actually achieved.

Then, conventionally, triac TR will open (become non-conducting) each time the voltage across it drops and becomes close to a zero value. The triac will be then turned back on at the beginning of the next half-wave (positive or negative) if the control order is still present.

It has been previously indicated that the control order is supplied in the form of a negative voltage with respect to the reference voltage and that transistors Q1 and Q2 have been connected accordingly. If the control order is supplied in the form of a positive pulse, the collector and emitter connections of each of transistors Q1 and Q2 should be inverted. However, the biasings illustrated on the drawing and described previously will be preferred because, as known, a better turn-on symmetry is generally obtained when operating with the indicated biasings, that is, in the second and third quadrants, rather than when operating in the first and fourth quadrants, which would occur if the control voltage was positive. Indeed, the triggerings in the fourth quadrant are generally hardly perceptible in the case of most existing triacs.

In a practical embodiment, a resistance R1 having a value of 120 kohms and a resistance R2 having a value of 330 kohms may be chosen. These values are given as an example only, since resistance R1 must have a high value to limit the consumption of the control circuit and resistance R2 must have a value likely to optimize the gate current of the triac. If R1=120 kohms and the voltage at terminals 10, 11, is the mains voltage at, for example, 220 effective volts, the mean current through resistor R1 will be 2 milliamperes and the circuit consumption will be about 0.4 watts.

Figure 2:
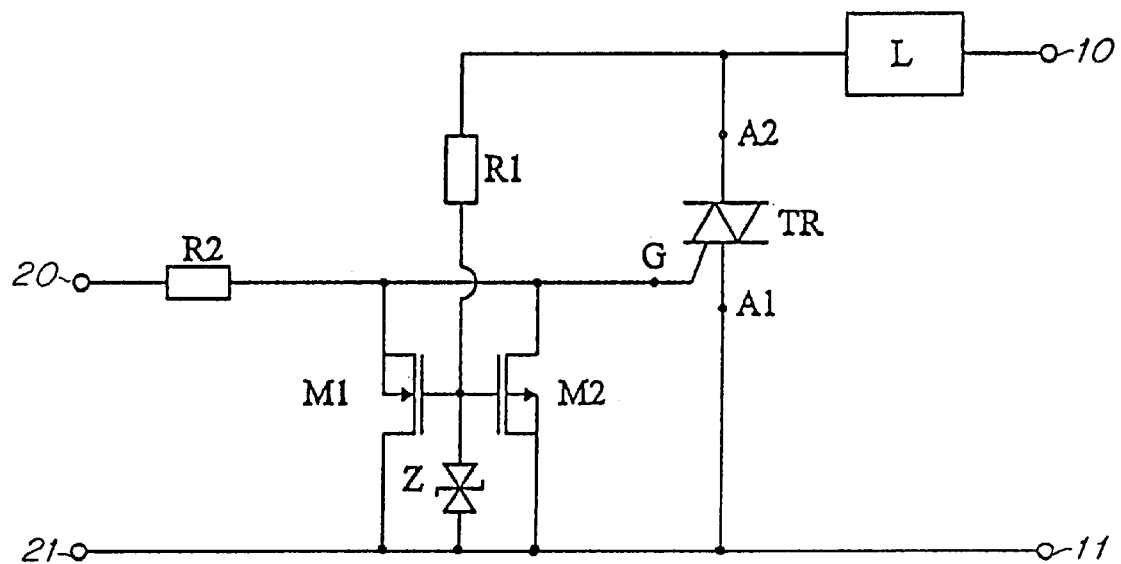
FIG. 2 shows a second embodiment of a circuit for controlling a triac at the voltage zero according to the present invention.

FIG. 2 shows an example of variant of the invention. The circuit is identical to that of FIG. 1, except that the complementary bipolar transistors Q1 and Q2 are replaced with N-channel and P-channel, respectively, complementary MOS enrichment transistors M1 and M2. In this embodiment, to avoid that a high gate voltage appears on transistors M1 and M2, a connection of the gates of the MOS transistors to the reference voltage is preferably provided, via a double avalanche diode Z which becomes conductive when the voltage on the gate exceeds a predetermined threshold (positive or negative), for example 20 volts. Further, the operation of the circuit of FIG. 2 is similar to that of FIG. 1.

Those skilled in the art will note that the present invention is likely to have various alterations, modifications, and improvements. In particular, FIGS. 1 and 2 show examples of implementation of the present invention in the form of discrete components. It should be clear that the triac and the associated complementary transistors altogether can be implemented monolithically. Further, these complementary transistors will be easy to implement since they only see a low voltage between their main terminals. Resistors R1 and R2 may also be integrated, bearing however in mind that resistor R1 must be in a high voltage technology since it has to withstand the mains voltage.

The above-described triac can also be a medium power triac, for controlling a triac, or other high power switch.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for controlling a triac at the voltage zero, including two transistors of complementary types connected in parallel between a gate and a main reference terminal of the triac, control terminals of the transistors being interconnected and connected to a second main terminal of the triac via a resistor of high value, and wherein the gate is connected to a d.c. control potential source via a second resistor.

2. A control circuit according to claim 1, wherein the voltage of the control potential source is switchable between a value of the voltage of the reference terminal and a negative value with respect to the voltage of the reference terminal.

3. A control circuit according to claim 1, wherein the complementary transistors are NPN and PNP bipolar transistors.

4. A control circuit according to claim 1, wherein the complementary transistors are N- and P-channel MOS transistors.

5. A control circuit according to claim 4, wherein a bidirectional avalanche diode is connected between a gate of the MOS transistors and the reference terminal.

6. A circuit for controlling a triac that has first and second main terminals and a gate terminal, said first and second main terminals coupled, respectively, to a first A.C. voltage terminal and via a load to a second A.C. voltage terminal, said circuit comprising:

a first transistor;

a second transistor of a type complementary to that of said first transistor;

a first sub-circuit for coupling said first and second transistors in parallel and between the triac gate terminal and first main terminal;

a second sub-circuit for intercoupling control terminals of the first and second transistors and coupling said control terminals to the triac second main terminal;

and a third sub-circuit for coupling the gate terminal of the triac to a D.C. control potential source.

7. A control circuit according to claim 6 wherein the voltage of the control potential source is switchable between a value of the voltage of the first main terminal and a negative value with respect to the voltage of the first main terminal.

8. A control circuit according to claim 6 wherein the complementary transistors are NPN and PNP bipolar transistors.

9. A control circuit according to claim 6 wherein the complementary transistors are N- and P-channel MOS transistors.

10. A control circuit according to claim 9 wherein a bi-directional avalanche diode is connected between a gate of the MOS transistors and the first main terminal.

11. A control circuit according to claim 6 wherein said first transistor is a NPN-type bipolar transistor.

12. A control circuit according to claim 11 wherein said second transistor is a PNP-type bipolar transistor.

13. A control circuit according to claim 12 wherein each of said first and second transistors has in addition to a control terminal, emitter and collector terminals.

14. A control circuit according to claim 13 wherein the emitter terminal of the first transistor is connected to the gate terminal of the triac and the collector terminal of the first transistor is connected to the first main terminal of the triac.

15. A control circuit according to claim 14 wherein the collector terminal of the second transistor connects to the gate terminal of the triac and the emitter terminal of the second transistor connects to the first main terminal.

16. A control circuit according to claim 15 wherein said first sub-circuit comprises interconnecting conductors.

17. A control circuit according to claim 16 wherein said second sub-circuit comprises a first resistance.

18. A control circuit according to claim 17 wherein said third sub-circuit comprises a second resistance.

19. A control circuit according to claim 18 wherein said second resistance is greater in value than said first resistance.

20. A control circuit according to claim 19 wherein said first resistance has a value on the order of 120 k ohms and said second resistance has a value on the order of 330 k ohms.

21. A circuit for controlling a triac that has first and second main terminals and a gate terminal, said first and second main terminals coupled, respectively, to a first A.C. voltage terminal and via a load to a second A.C. voltage terminal, said circuit comprising:

a first transistor having at least a control terminal;

a second transistor also having at least a control terminal and of a type complementary to that of said first transistor;

means for coupling said first and second transistors in parallel and between said gate and first main terminals of said triac;

means for interconnecting the control terminals of the respective first and second transistors;

means for coupling the interconnected control terminals of the first and second transistors to the second main terminal of said triac;

and means for coupling the gate terminal of the triac to a D.C. control potential source.

22. A control circuit according to claim 21 wherein the voltage of the control potential source is switchable between a value of the voltage of the first main terminal and a negative value with respect to the voltage of the first main terminal.

23. A control circuit according to claim 22 wherein the complementary transistors are NPN and PNP bipolar transistors.

24. A control circuit according to claim 23 wherein the complementary transistors are N- and P-channel MOS transistors.

25. A control circuit according to claim 24 further including a bi-directional avalanche diode connected between a gate of the MOS transistors and the first main terminal.

26. A control circuit according to claim 21 wherein means for coupling said first transistors in parallel includes intercoupling conductors.

27. A control circuit according to claim 26 wherein said means for coupling the interconnected control terminals of the first and second transistors to the second main terminal of the triac includes a first resistance means.

28. A control circuit according to claim 27 wherein said means for coupling the gate terminal of the triac to a D.C. control potential source includes a second resistance means.

* * * * *